(12) United States Patent
Fujisawa

(10) Patent No.: US 7,808,293 B2
(45) Date of Patent: Oct. 5, 2010

(54) CLOCK DISTRIBUTION CIRCUIT

(75) Inventor: Toshio Fujisawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/399,463

(22) Filed: Mar. 6, 2009

(65) Prior Publication Data
US 2009/0224812 A1 Sep. 10, 2009

(30) Foreign Application Priority Data
Mar. 10, 2008 (JP) ............................. 2008-060182

(51) Int. Cl.
*G06F 1/04* (2006.01)
*H03H 11/26* (2006.01)
(52) U.S. Cl. ................. 327/295; 327/291; 327/276
(58) Field of Classification Search ......... 327/291–295, 327/290, 152–158, 276
See application file for complete search history.

(56) References Cited

U.S. PATENT DOCUMENTS 5,491,442 A * 2/1996 Mirov et al. ............... 327/295
7,023,252 B2 * 4/2006 Schultz ...................... 327/161
7,317,342 B2 * 1/2008 Saint-Laurent ............. 327/295

FOREIGN PATENT DOCUMENTS
JP 2006-3249 1/2006

OTHER PUBLICATIONS

Shidhartha Das, et al., "A Self-Tuning DVS Processor Using Delay-Error Detection and Correction", 2005 Symposium on VLSI Circuits Digest of Technical Papers, pp. 258-261.
U.S. Appl. No. 12/483,445, filed Jun. 12, 2009, Fujisawa.

* cited by examiner

*Primary Examiner*—Dinh T. Le
(74) *Attorney, Agent, or Firm*—Oblon, Spivak, McClelland, Maier & Neustadt, L.L.P.

(57) ABSTRACT

A clock distribution circuit includes a monitoring circuit that delays a signal based on a clock signal from a clock tree by using multiple inverter circuits and predicts a timing violation on the basis of the amount of delay produced by the multiple inverter circuits. The clock distribution circuit further includes an OR circuit that controls, on the basis of the result of prediction by the monitoring circuit, a clock gating signal generated by a combinational circuit and a clock gating circuit that supplies a clock signal or stops supply of the clock signal depending on a signal output from the OR circuit.

17 Claims, 6 Drawing Sheets

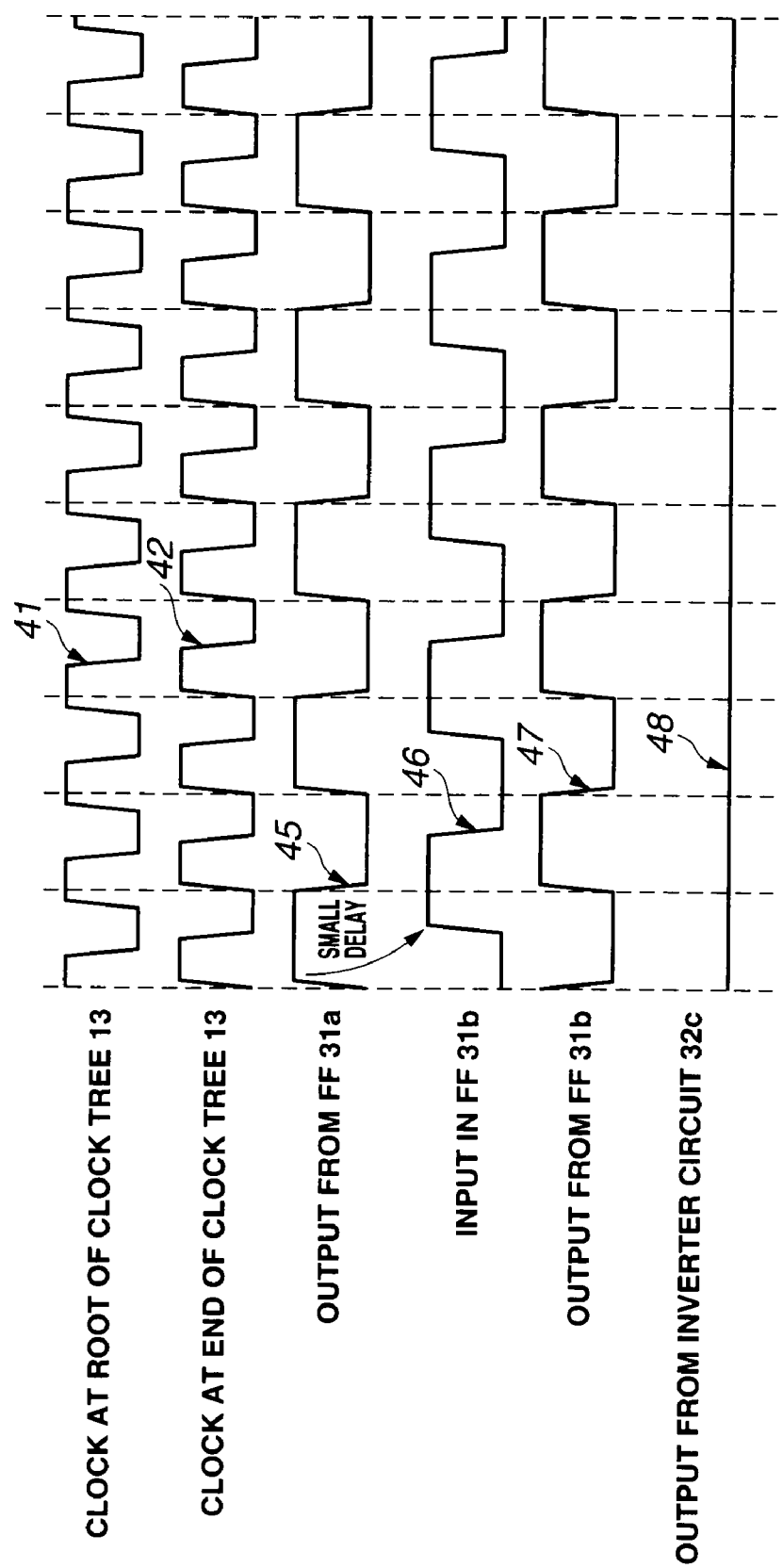

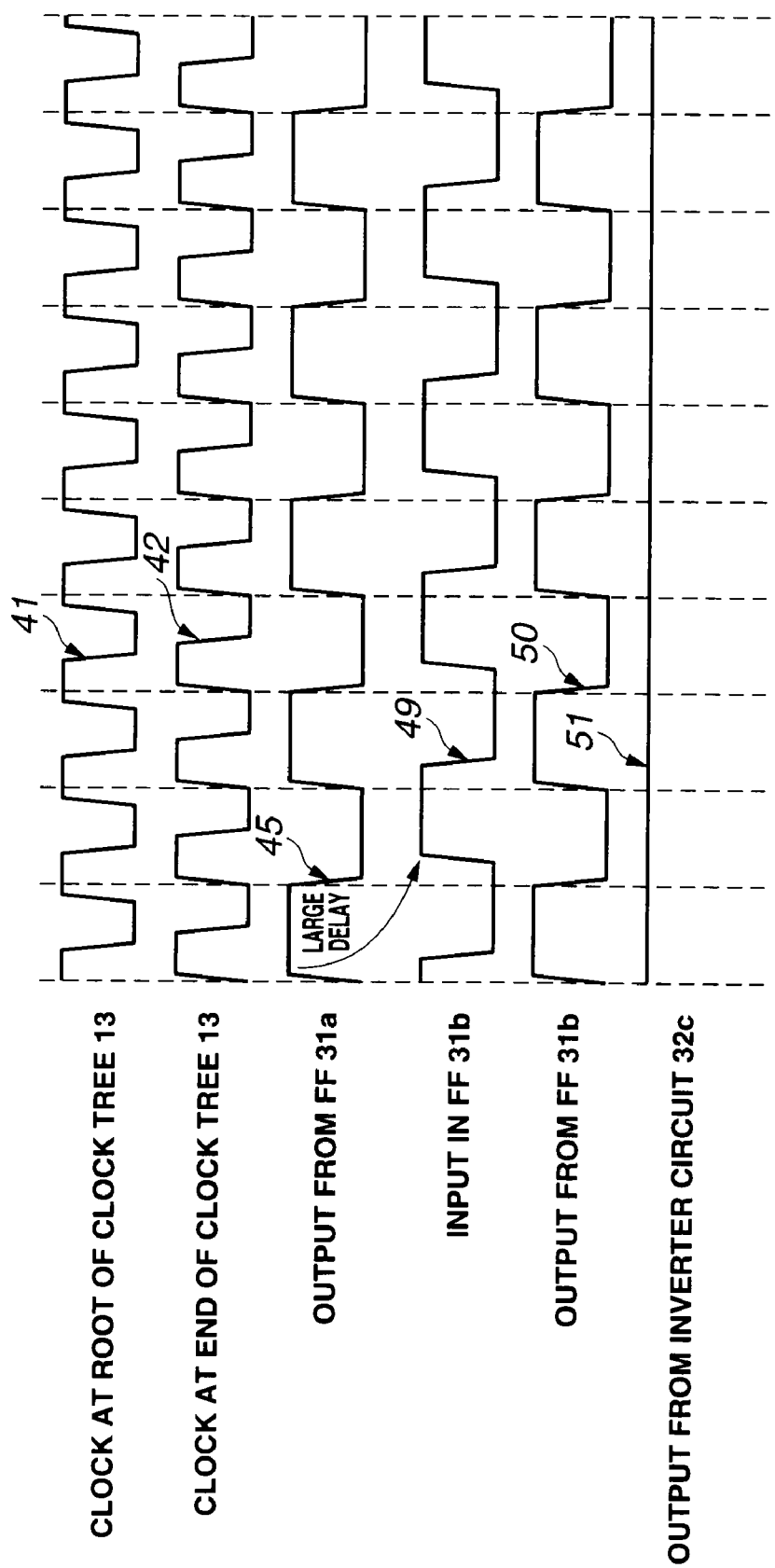

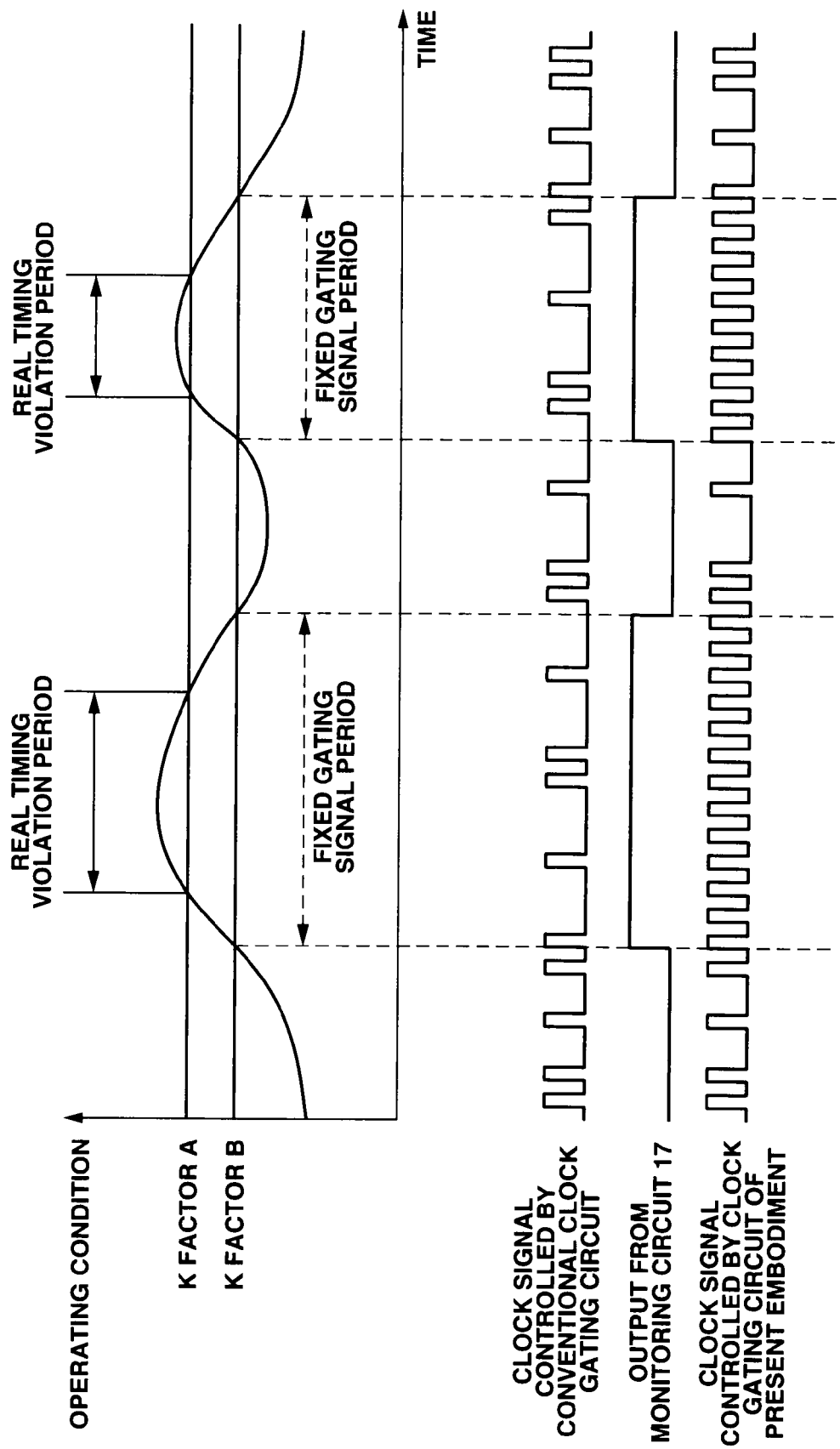

CLOCK DISTRIBUTION CIRCUIT

CROSS-REFERENCE TO RELATED APPLICATIONS

This application is based upon and claims the benefit of priority from the prior Japanese Patent Application No. 2008-060182 filed in Japan on Mar. 10, 2008; the entire contents of which are incorporated herein by this reference.

BACKGROUND OF THE INVENTION

1. Field of the Invention

The present invention relates to a clock distribution circuit and, in particular, to a clock distribution circuit having a clock gating circuit.

2. Description of the Related Art

As semiconductor integrated circuits have increased in scale and speed in recent years, power consumption in the semiconductor integrated circuits has also become a matter of utmost concern. As a technique for reducing power consumption in semiconductor integrated circuits, a method of controlling a clock signal by a clock gating circuit has been known.

The clock gating circuit stops supply of the clock signal to a flip-flop (hereinafter abbreviated as FF) circuit when a memory element, for example the FF, does not need to be supplied with a clock signal. That is, when supplying a clock signal that does not update the content of the FF, the clock gating circuit fixes the clock signal at "0" or "1". This reduces the number of level changes of the clock signal and therefore can reduce power consumption in the circuit. Clock distribution circuits that use such a clock gating circuit to reduce power consumption in logic circuits have been proposed (for example see Japanese Patent Application Laid-Open Publication No. 2006-3249).

A conventional clock distribution circuit includes a phase-locked loop (PLL) which generates clock signals with different frequencies, a clock gating circuit, a clock tree, multiple FFs connected to an end of the clock tree, and a combinational circuit which generates a clock gating signal on the basis of an output or outputs from one or more FFs.

The clock tree consists of buffers with an identical driving performance connected in the form of a tree in order to supply a clock signal from the PLL to many FFs in the same phase. Accordingly, clock signals appearing at the ends of the clock tree are in phase with each other but are delayed from the clock signal at the root of the clock tree by several nanoseconds. In general, as the number of FFs connected increases, the number of buffer stages of the clock tree increases and so does the amount of the delay of the clock signal that propagated through the clock tree.

Part of FFs connected at the ends of the clock tree generate, on the basis of the delayed clock signal, control signals from which clock gating signals are generated. The combinational circuit generates a clock gating signal on the basis of the generated control signals. That is, in addition to an amount of delay produced by the clock tree, an amount of delay produced by logic gates included in the combinational circuit for generating the clock gating signal are added to the clock gating signal.

The clock gating circuit has the function of passing or blocking a clock signal depending on the value of the clock gating signal. For example, when the value of the clock gating signal is "1", the clock gating circuit passes the clock signal; when the value of the clock gating signal is "0", the clock gating circuit blocks the clock signal.

However, since the clock gating circuit uses a clock gating signal to which an amount of delay produced by the clock tree and logic gates is added to control an undelayed clock signal, that is, a clock signal from the PLL, a path including the clock gating signal is subject to a severe timing constraint. In particular, the amount of delay time allowable in the combinational circuit provided between the FF at an end of the clock tree and the clock gating circuit is smaller.

Furthermore, as the number of FFs has increased and clock frequencies have also increased recently, amounts of delay produced by a clock tree and logic gates appear relatively large. Therefore, there is a problem that a timing violation occurs in a path including a clock gating signal when the amount of delay of signal propagation increases due to a power supply voltage drop or a chip temperature rise, for example, under severe operating conditions.

BRIEF SUMMARY OF THE INVENTION

According to one aspect of the present invention, there is provided a clock distribution circuit including: a clock tree configured to delay a clock signal supplied from a clock generating unit; one or more flip-flops configured to operate in accordance with a clock signal delayed by the clock tree; a combinational circuit configured to generate a clock gating signal on the basis of a signal output from the one or more flip-flops; a monitoring circuit including a first delay unit the number of delay element stages of which is set on the basis of the clock tree and the combinational circuit and a second delay unit configured to delay an output from the first delay unit by a predetermined amount of delay, the monitoring circuit being configured to delay a signal based on a clock signal from the clock tree by using the first and second delay units and predict a timing violation on the basis of an amount of delay produced by the first and second delay units; a first logic gate configured to control the clock gating signal on the basis of a result of prediction by the monitoring circuit; and a clock gating circuit configured to control whether to allow supply or stop supply of a clock signal from the clock generating unit on the basis of a signal output from the first logic gate.

BRIEF DESCRIPTION OF THE DRAWINGS

FIG. 4 is a timing chart illustrating operation of the monitoring circuit in the absence of a timing violation;

FIG. 5 is a timing chart illustrating operation of the monitoring circuit in the presence of a timing violation; and FIG. 6 is a timing chart illustrating operation of the clock distribution circuit.

DETAILED DESCRIPTION OF THE EMBODIMENT OF THE INVENTION

An embodiment of the present invention will be described below with reference to the accompanying drawings.

Figure 1:
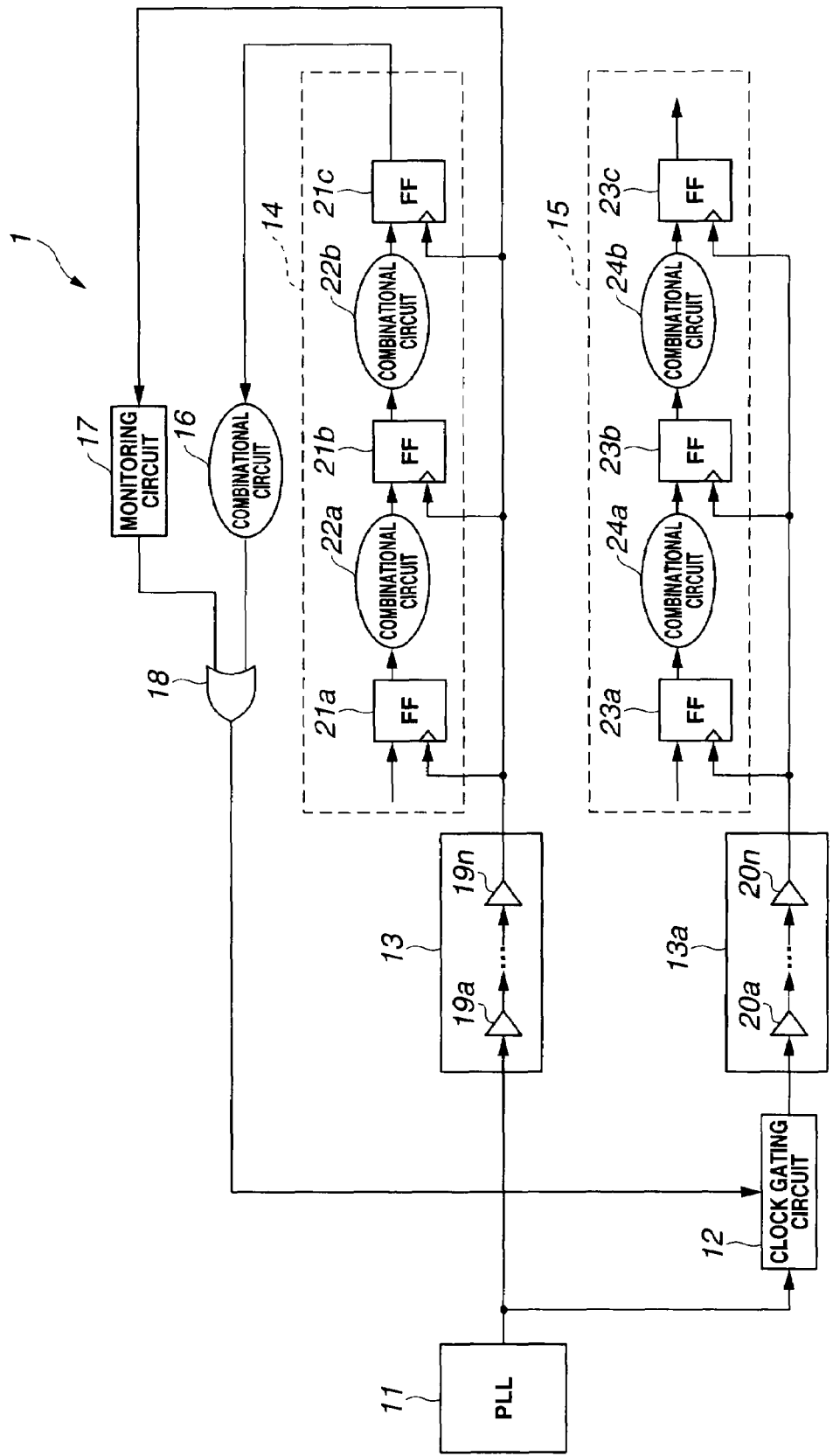
FIG. 1 is a block diagram showing a configuration of a clock distribution circuit according to one embodiment of the present invention.

A configuration of a clock distribution circuit according to one embodiment of the present invention will be described first with respect to FIG. 1. FIG. 1 is a block diagram showing a configuration of the clock distribution circuit according to one embodiment of the present invention.

As shown in FIG. 1, the clock distribution circuit 1 according to the embodiment includes a phase-locked loop (PLL) 11, a clock gating circuit 12, clock trees 13 and 13a, FF groups 14 and 15, a combinational circuit 16, a monitoring circuit 17, and an OR circuit 18. The clock tree 13 includes multiple buffers 19a to 19n and the clock tree 13a includes multiple buffers 20a to 20n. The FF group 14 includes three FFs 21a, 21b, and 21c and two combinational circuits 22a and 22b. The FF group 15 includes three FFs 23a, 23b, and 23c and two combinational circuits 24a and 24b. However, each of the FF groups 14 and 15 may include one, two or more than three FFs.

The PLL 11 generates a clock signal with a predetermined frequency to be supplied to the FF groups 14 and 15 and supplies the generated clock signal to the clock gating circuit 12 and the clock tree 13.

The clock gating circuit 12 supplies the clock signal or stops supply of the clock signal from the PLL 11 to the FF group 15 depending on a clock gating signal, which will be described later.

The clock tree 13 propagates the clock signal supplied from the PLL 11 through multiple buffers 19a to 19n and supplies the propagated clock signal to each of the FFs 21a to 21c in the FF group 14 and the monitoring circuit 17.

The combinational circuit 16 generates a clock gating signal on the basis of the signal supplied from FF 21c and outputs the generated clock gating signal to the OR circuit 18. While the combinational circuit 16 generates the clock gating signal on the basis of the signal output from FF 21c, the combinational circuit 16 may generate the clock signal on the basis of signals output from more than one FF.

The monitoring circuit 17 outputs the logical value "1" to the OR circuit 18 under severe operating conditions and outputs the logical value "0" to the OR circuit 18 under nonsevere operating conditions. Here, a severe operating condition may be a power supply voltage drop or a chip temperature rise; a nonsevere operating condition may be a power supply voltage rise or a chip temperature drop. It is known that, in general, the amount of signal propagation delay increases as power supply voltage decreases or chip temperature increases. That is, under a severe operating condition, the amount of signal propagation delay increases and therefore the possibility of a timing violation increases. A configuration of the monitoring circuit 17 will be detailed later with reference to FIG. 2.

The OR circuit 18 fixes the clock gating signal from the combinational circuit 16 at "1" and outputs the clock gating signal to the clock gating circuit 12, when the monitoring circuit 17 outputs "1". When the monitoring circuit 17 outputs "0", the OR circuit 18 passes the clock gating signal from the combinational circuit 16 to the clock gating circuit 12.

The clock gating circuit 12 allows or stops supply of a clock signal from the PLL 11 to the FF group 15 depending on the output from the OR circuit 18. When the OR circuit 18 outputs "1", the clock gating circuit 12 allows the clock signal from PLL 11 to be supplied to the FF group 15; when the OR circuit 18 outputs "0", the clock gating circuit 12 stops supply of the clock signal. In this case, the clock gating circuit 12 should include an AND circuit.

While the clock gating circuit 12 allows supply of the clock signal from the PLL 11 to the FF group 15 when "1" is output from the OR circuit 18 and stops supply of the clock signal when "0" is output from the OR circuit 18, the clock gating circuit 12 may allow the clock signal from the PLL 11 to be supplied to the FF group 15 when "0" is output from the OR circuit 18 and may stop supply of the clock signal when "1" is output from the OR circuit 18. In this case, the clock gating circuit 12 should include an OR circuit.

The clock signal controlled by the clock gating circuit 12 in this way is supplied to the clock tree 13a. The clock tree 13a propagates the clock signal supplied from the clock gating circuit 12 through multiple buffers 20a to 20n and supplies the propagated clock signal to each of the FFs 23a to 23c in the FF group 15.

Each of the FFs 23a to 23c in the FF group 15 takes in an input signal in accordance with the clock signal controlled by the clock gating circuit 12 and delayed by the clock tree 13a and outputs the input signal.

Figure 2:
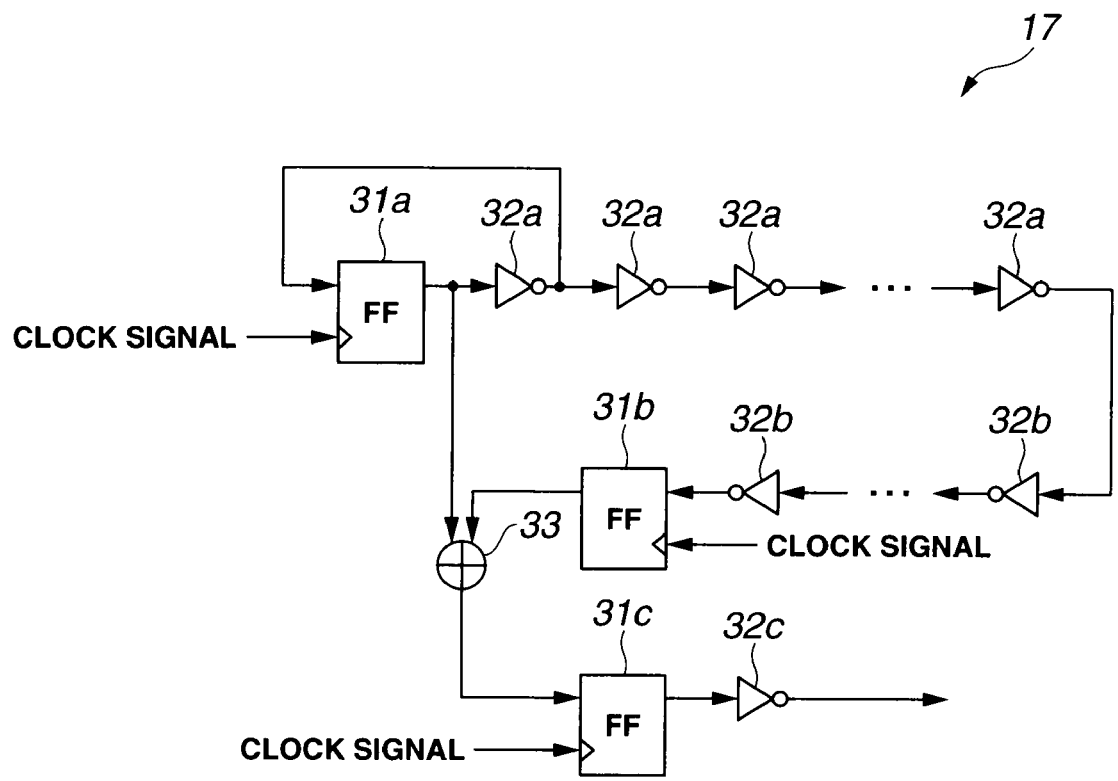
FIG. 2 is a block diagram showing a configuration of a monitoring circuit.

A configuration of the monitoring circuit 17 will now be described which outputs the logical value "1" under a severe operating condition and outputs the logical value "0" under a nonsevere operation condition. FIG. 2 is a block diagram showing a configuration of the monitoring circuit 17.

As shown in FIG. 2, the monitoring circuit 17 includes three FFs 31a, 31b, and 31c, groups of inverter circuits 32a and 32b, an inverter circuit 32c, and an EXOR circuit 33. The inverter circuits 32a form a first delay unit and the inverter circuits 32b form a second delay unit.

A clock signal from the clock tree 13, in other words, a clock signal that appears at an end of the clock tree 13 is supplied to the monitoring circuit 17. Each of FFs 31a to 31c operates at a rising edge of the clock signal from the clock tree 13. FFs 31a to 31c may operate at a falling edge of the clock signal from the clock tree 13.

FF 31a takes in an output from a first stage inverter circuit 32a among the multiple inverter circuits 32a at the rising edge of the clock signal from the clock tree 13 and outputs it to the first stage inverter circuit 32a and the EXOR circuit 33. The first stage inverter circuit 32a inverts the output from FF 31a and outputs the inverted signal to FF 31a and a next stage inverter circuit 32a. That is, a signal inverted by the first stage inverter circuit 32a is taken into FF 31a at the rising edge of the clock signal.

The signal supplied to the first stage inverter circuit 32a propagates through the multiple inverter circuits 32a and 32b and is supplied to FF 31b. That is, the output from FF 31a is delayed by an amount of time equivalent to the number of the inverter circuit stages provided between FF 31a and FF 31b and is then supplied to FF 31b. The number of the inverter circuits 32a corresponds to the sum of the number of stages of the clock tree 13 and the number of logic gate stages of the combinational circuit 16. That is, the amount of delay produced by the clock tree 13 and the combinational circuit 16 can be estimated from the number of the inverter circuits 32a. The number of the inverter circuits 32a is set so that a predetermined delay amount can be produced. As the amount of delay produced by the clock tree 13 and the combinational circuit 16 changes due to a temperature change, the amount of delay produced by the inverter circuits 32a changes accordingly. The amount of delay produced by the inverter circuits 32a and 32b is always greater than the amount of delay produced by the clock tree 13 and the combinational circuit 16 by the amount of delay produced by the inverter circuits 32b. Before a timing violation occurs due to an increase in the amount of delay produced by the clock tree 13 and the combinational circuit 16, the timing violation can be detected in advance from the amount of delay produced by the inverter circuits 32a and 32b. An even number of inverter circuits are provided between FF 31a and FF 31b.

FF 31b takes in an output from the last stage inverter circuit 32b at a rising edge of the clock signal from the clock tree 13 and outputs it to the EXOR circuit 33.

The EXOR circuit 33 applies an EXOR operation on values input from FF 31a and FF 31b and outputs the result of the EXOR operation to FF 31c.

FF 31c takes in the result of the EXOR operation input at the rising edge of the clock signal from the clock tree 13 and outputs the result to the inverter circuit 32c.

The inverter circuit 32c inverts the input from FF 31c and outputs the inverted signal to the clock gating circuit 12.

Operation of the embodiment configured as described above will be described next.

Figure 3:
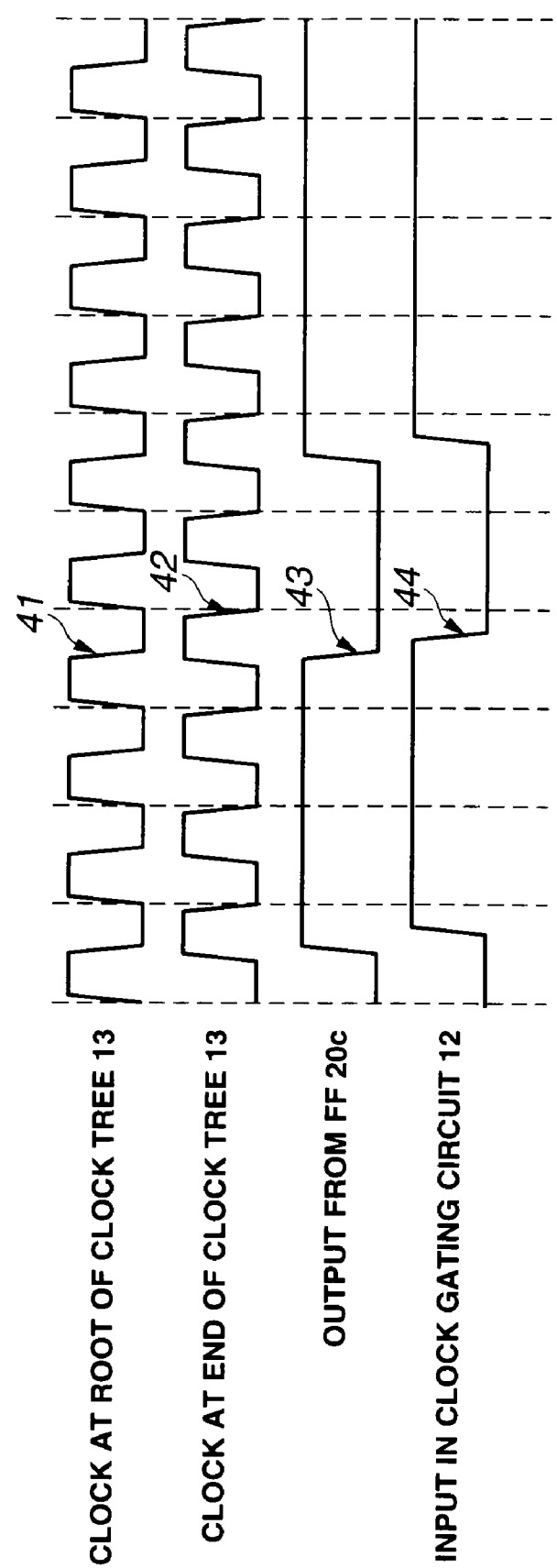
FIG. 3 is a timing chart illustrating an amount of delay in a path including a clock gating signal.

An amount of delay in a path including a clock gating signal will be described first. FIG. 3 is a timing chart illustrating an amount of delay in a path including a clock gating signal.

A clock signal output from the PLL 11 is input in the clock tree 13. Arrow 41 indicates a waveform of the input clock signal at the root of the clock tree 13.

The clock signal input in the clock tree 13 is delayed by multiple buffers 19a to 19n and the delayed clock signal is then output to FF group 14. Arrow 42 indicates a waveform of the clock signal that appears at the end of the clock tree 13.

The clock signal thus delayed is input in the FF group 14. At FF 21c in the FF group 14, a signal from which a clock gating signal will be generated is generated on the basis of the delayed clock signal and the generated signal is output to the combinational circuit 16. Arrow 43 indicates the output from the FF group 14.

In the combinational circuit 16, a clock gating signal is generated on the basis of the signal from the FF group 14. In particular, the clock gating signal is generated by adding the amount of delay produced by the logic gate stages of the combinational circuit 16 to the signal. Arrow 44 indicates a waveform of the clock gate signal generated by the combinational circuit 16.

In this way, the amount of delay produced by the clock tree 13 and the amount of delay produced by the logic gates generating the clock gating signal are added to the path including the clock gating signal. Conventionally, the clock gating signal has been input in the clock gating circuit 12.

The clock gating circuit 12 controls the clock signal before amounts of delays are added, namely the clock signal from the PLL 11, on the basis of the clock gating signal delayed by the clock tree 13 and the combinational circuit 16. Accordingly, setup time would be tight. In the example in FIG. 3, there is not a timing violation. However, under a severe operating condition, signal propagation delay increases and the possibility of occurrence of timing violation increases accordingly.

In the present embodiment, when the operating condition becomes severe and a timing violation is likely to occur, the monitoring circuit 17 outputs "1" and the OR circuit 18 fixes the clock gating signal at "1". That is, under a severe operating condition, the clock gating signal is masked to prevent a timing violation.

Operation of the monitoring circuit 17 in the absence of a timing violation under a nonsevere condition will now be described. FIG. 4 is a timing chart illustrating operation of the monitoring circuit 17 in the absence of a timing violation.

As has been described above, each of FFs 31a to 31c of the monitoring circuit 17 operates at a rising edge of a clock signal output from the clock tree 13. First, an output from the first stage inverter circuit 32a is taken in FF 31a at a rising edge of a clock signal. The value taken in FF 31a is output to the first stage inverter circuit 32a and the EXOR circuit 33. The inverter circuit 32a inverts the input value and outputs the inverted value to FF 31a and a next stage inverter circuit 32a. The output from the first stage inverter circuit 32a is taken into FF 31a at a next rising edge of the clock signal and is output to the inverter circuit 32a and the EXOR circuit 33. That is, FF 31a alternately outputs "0" and "1" every cycle.

The output from FF 31a is delayed by the multiple inverter circuits 32a and 32b and is then input in FF 31b. Thus, the input in FF 31b has a waveform as indicated by arrow 46. The amount of delay produced by the multiple inverter circuits 32a and 32b is equal to the sum of the amount of delay produced by the clock tree 13, the amount of delay produced by the logic gates that generate a clock gating signal, and a predetermined amount of delay.

At FF 31b, an output from the last stage inverter circuit 32b is taken in at a rising edge of the clock signal output from the clock tree 13 and is output to the EXOR circuit 33. Thus, the output from FF 31b has a waveform as indicated by arrow 47. In this way, when the operating conditions are not severe and therefore the amount of delay produced by the multiple inverter circuits 32a and 32b is within one cycle of the clock signal, outputs from FF 31a and FF 31b are inverse to each other. That is, when the phase difference between the output from FF 31a and the output from FF 31b is within one cycle of the clock signal, the outputs from FF 31a and FF 31b are inverse to each other.

The outputs from FF 31a and FF 31b are supplied to the EXOR circuit 33. The inverse values, "0" and "1" as shown in FIG. 4 are input in the EXOR circuit 33, where the values are EXORed. Consequently, the EXOR circuit 33 always outputs "1" as the result of the EXOR operation.

The output from the EXOR circuit 33 is taken into FF 31c and then the value is inverted by the inverter circuit 32c. The inverter circuit 32c always output "0" as indicated by arrow 48. Consequently, under nonsevere conditions, the monitoring circuit 17 outputs "0" to the OR circuit 18 and the clock gating signal output from the combinational circuit 16 is input in the clock gating circuit 12.

The clock gating circuit 12 allows or stops supply of the clock signal from the PLL 11 to the FF group 15 depending on the clock gating signal output from the combinational circuit 16. That is, the clock signal from the PLL 11 is controlled by the same logic as that of a conventional clock gating signal. Accordingly, a power saving effect equivalent to that of a conventional clock gating circuit is provided in terms of dynamic power consumption.

Operation of the monitoring circuit 17 when a timing violation occurs due to a severe operating condition will be described next. FIG. 5 is a timing chart illustrating operation of the monitoring circuit 17 when a timing violation occurs. Description of operations in FIG. 5 that are the same as those in FIG. 4 will be omitted.

Arrow 49 indicates a waveform when there is a large amount of signal propagation delay due to a severe operating condition, that is, the amount of delay produced by the multiple inverter circuits 32a and 32b is not within one cycle of a clock signal.

An output from the last stage inverter circuit 32b is taken into FF 31b at a rising edge of a clock signal output from the clock tree 13 and then is output to the EXOR circuit 33. The output from FF 31b has a waveform indicated by arrow 50. When the amount of delay produced by the multiple inverter circuits 32a and 32b is not within one cycle of the clock signal in this way because of a severer operating condition, FF 31a and FF 31b output identical values. That is, when the phase difference between the output from FF 31a and the output from FF 31b is not within one cycle of the clock signal, the values output from FF 31a and FF 31b are identical.

The outputs from FF 31a and FF 31b are supplied to the EXOR circuit 33. The values input in the EXOR circuit 33 are identical as shown in FIG. 5 and the EXOR circuit 33 applies an EXOR operation on the input values. Consequently, the EXOR circuit 33 always output "0" as the result of the EXOR operation between the outputs from FF 31*a* and FF 31*b*.

The output from the EXOR circuit 33 is taken in FF 31*c*, is inverted by the inverter circuit 32*c*, and then output. That is, the inverter circuit 32*c* always output "1" as indicated by arrow 51. Consequently, under severe conditions, the monitoring circuit 17 always outputs "1", thereby always fixing the clock gating signal output from the OR circuit 18 at "1". The clock gating signal fixed at "1" by the OR circuit 18 is input in the clock gating circuit 12. The clock gating circuit 12 continues supplying the clock signal from the PLL 11 to the FF group 15 on the basis of the clock gating signal fixed at "1".

That is, when the operating conditions are becoming severe, the monitoring circuit 17 detects a timing violation in advance and masks the clock gating signal before the operating condition reaches a point at which the timing violation would occur in a path including a conventional clock gating signal.

FIG. 6 is a timing chart illustrating operation of the clock distribution circuit 1.

A graph shown in FIG. 6 shows operating condition versus time. The severity of operating condition is represented by a variable, K factor. K factor A is a temperature or power supply voltage condition at which the clock gating signal causes a timing violation. K factor B is a temperature or power supply voltage condition at which the monitoring circuit 17 causes a timing violation. As the power supply voltage increases or chip temperature decreases, the value of the K factor decreases. In contrast, as power supply voltage decreases or chip temperature increases, the value of the K factor increases.

As has been described above, an amount of delay is set in the multiple inverter circuits 32*a* and 32*b* of the monitoring circuit 17 that is equal to the sum of the amount of delay by the clock tree 13, the amount of delay by the logic gate stages that generate the clock gating signal, and a predetermined amount of delay. The monitoring circuit 17 detects a timing violation on the basis of the set amount of delay. Therefore, the monitoring circuit 17 detects the timing violation at K factor B before the timing violation actually occurs in the path including the clock gating signal at K factor A. When the monitoring circuit 17 detects the timing violation, the monitoring circuit 17 outputs the logic value "1" to the OR circuit 18. When the monitoring circuit 17 outputs "1", the OR circuit 18 fixes the clock gating signal at "1". Consequently, the clock gating circuit 12 passes the clock signal from the PLL 11 to the FF group 15.

In this way, the monitoring circuit 17 detects a timing violation at K factor B that is smaller than K factor A at which the timing violation occurs in the path including the clock gating signal. Therefore, the timing violation period of the path including the clock gating signal is encompassed in the period during which the monitoring circuit 17 is outputting "1". Thus, the timing violation period of the path including the clock gating signal is always masked.

As has been described above, the clock distribution circuit 1 includes the monitoring circuit 17 that outputs a control signal for masking a clock gating signal under a severe condition and the OR circuit 18 that masks the clock gating signal. The monitoring circuit 17 has multiple inverter circuits 32*a* and 32*b* in which an amount of delay is set that is equal to the sum of the amount of delay by the clock tree 13, the amount of delay by the logic gates that generate the clock gating signal, and a predetermined amount of delay. The monitoring circuit 17 detects a timing violation in advance on the basis of the set amount of delay. Consequently, the clock distribution circuit 1 can detect the timing violation and mask the clock gating signal before an operating condition that causes the timing violation of the clock gating signal develops.

Therefore, the clock distribution circuit of the present embodiment is capable of preventing occurrence of a timing violation in a path including a clock gating signal under severe operating conditions.

Furthermore, the clock distribution circuit can reduce the time required for timing convergence in logic synthesis because timing constraints under severe operating conditions are relaxed. In addition, when a certain condition is given in logic synthesis, logic gates that consume less power than conventional ones can be assigned to a path including a clock gating signal because timing constraints under severe conditions are relaxed. That is, the clock distribution circuit according to the present embodiment has advantageous effects of reducing the time required for timing convergence in logic synthesis and reducing power consumption in logic circuits.

The present invention is not limited to the embodiment described above. Various changes and modifications can be made without departing from the present invention.

What is claimed is:

1. A clock distribution circuit comprising:
    a clock tree configured to delay a first clock signal supplied from a clock generating unit to a second clock signal;
    one or more flip-flops configured to operate in accordance with the second clock signal;
    a combinational circuit connected to the one or more flip-flops, the combination circuit configured to receive a signal output from the one or more flip-flops and generate a clock gating signal;
    a monitoring circuit including a first delay unit configured to generate an amount of first time delay equal to an amount of time delay by the clock tree and the combinational circuit, and a second delay unit configured to delay an output from the first delay unit by a predetermined amount of second time delay, the monitoring circuit configured to delay a signal taken in by the second clock signal from the clock tree by using the first and second delay units and to predict a timing violation according to whether or not an amount of the first and second time delay produced by the first and second delay units is equal to or greater than a predetermined amount of time;
    a first logic gate connected to the monitoring circuit and the combinational circuit, the first logic gate configured to fix the clock gating signal to a fixed value and output the signal when the monitoring circuit has predicted presence of the timing violation, and to allow the clock gating signal to pass and be output as-is when the monitoring circuit has predicted absence of the timing violation; and
    a clock gating circuit connected to the first logic gate and the clock generating unit, the clock gating circuit configured to control supply of the first clock signal from the clock generating unit when the clock gating signal is passed and output as-is from the first logic gate, and to control to stop supply of the first clock signal from the clock generating unit when the fixed value is output from the first logic gate.

2. The clock distribution circuit according to claim 1, wherein:
    the monitoring circuit predicts the timing violation based on whether or not a phase difference between an input in the first delay unit and an output from the second delay unit exceeds a predetermined value.

3. The clock distribution circuit according to claim 2, wherein the predetermined value is equal to one cycle of the second clock signal delayed by the clock tree.

4. The clock distribution circuit according to claim 2, wherein the monitoring circuit predicts the timing violation based on whether or not an input in the first delay unit and an output from the second delay unit are inverse to each other.

5. The clock distribution circuit according to claim 1, wherein the clock gating circuit includes AND circuit or an OR circuit.

6. The clock distribution circuit according to claim 1, wherein the first delay unit is configured by a plurality of inverter circuits.

7. The clock distribution circuit according to claim 1, wherein the second delay unit includes a plurality of inverter circuits to delay an output from the first delay unit by the predetermined amount of second time delay.

8. The clock distribution circuit according to claim 1, wherein the clock tree is formed by a plurality of buffer circuits.

9. The clock distribution circuit according to claim 1, wherein the first logic gate is an OR circuit.

10. The clock distribution circuit according to claim 1, wherein the clock generating unit is a phase-locked loop (PLL) circuit.

11. The clock distribution circuit according to claim 1, wherein the monitoring circuit comprises:
 a first flip-flop configured to operate in accordance with the second clock signal delayed by the clock tree;
 a second logic gate including the first delay unit configured to generate the amount of first time delay equal to the amount of time delay by the clock tree and the combinational circuit and the second delay unit configured to delay an output from the first delay unit by the predetermined amount of second time delay;
 a second flip-flop configured to take in an output from the second logic gate in accordance with the second clock signal delayed by the clock tree; and
 a third logic gate configured to perform a logic operation on outputs from the first and second flip-flops; and
 the monitoring circuit detects the timing violation on the basis of an output from the third logic gate.

12. The clock distribution circuit according to claim 11, wherein the third logic gate predicts the timing violation based on whether or not a phase difference between an output from the first flip-flop and an output from the second flip-flop exceeds a predetermined value.

13. The clock distribution circuit according to claim 11, wherein the third logic gate detects that the phase difference is shifted by one cycle of the second clock signal delayed by the clock tree based on whether or not an output from the first flip-flop and an output from the second flip-flop are inverse to each other and predicts the timing violation.

14. The clock distribution circuit according to claim 11, wherein the first delay unit is configured by a plurality of inverter circuits.

15. The clock distribution circuit according to claim 11, wherein the second delay unit comprises a plurality of inverter circuits to delay an output from the first delay unit by the predetermined amount of second time delay.

16. The clock distribution circuit according to claim 11, wherein the second logic gate is formed by an even number of inverter circuits.

17. The clock distribution circuit according to claim 11, wherein the third logic gate is an EXOR circuit configured to perform an EXOR operation.

* * * * *